(12) United States Patent
Lee

(10) Patent No.: US 7,579,826 B2
(45) Date of Patent: Aug. 25, 2009

(54) TEST SOCKET FOR SEMICONDUCTOR

(76) Inventor: Soo Ho Lee, 307-1004 Galhoon Apt., Queenstown, 372 Boolo-dong, Seo-gu, Incheon 404-270 (KR)

( * ) Notice: Subject to any disclaimer, the term of this patent is extended or adjusted under 35 U.S.C. 154(b) by 0 days.

(21) Appl. No.: 11/960,993

(22) Filed: Dec. 20, 2007

(65) Prior Publication Data
US 2008/0157806 A1 Jul. 3, 2008

(30) Foreign Application Priority Data
Dec. 29, 2006 (KR) .................. 10-2006-0138364
Dec. 6, 2007 (KR) .................. 10-2007-0126227

(51) Int. Cl.
*G01R 31/28* (2006.01)
(52) U.S. Cl. .................. 324/158.1; 439/91; 439/66
(58) Field of Classification Search ......... 324/754–765, 324/158.1; 439/66, 91, 81
See application file for complete search history.

(56) References Cited

U.S. PATENT DOCUMENTS

| 4,402,562 | A | * | 9/1983 | Sado ........................... 439/91 |
| 4,793,814 | A | * | 12/1988 | Zifcak et al. .................. 439/66 |
| 5,309,324 | A | * | 5/1994 | Herandez et al. ............. 361/734 |
| 5,324,205 | A | * | 6/1994 | Ahmad et al. ................ 439/66 |
| 5,385,477 | A | * | 1/1995 | Vaynkof et al. ............... 439/66 |
| 5,427,535 | A | * | 6/1995 | Sinclair ........................ 439/66 |
| 5,828,226 | A | * | 10/1998 | Higgins et al. .............. 324/762 |
| 6,499,216 | B1 | * | 12/2002 | Fjelstad ........................ 29/842 |
| 6,724,203 | B1 | * | 4/2004 | Goldmann et al. .......... 324/754 |
| 6,841,882 | B2 | * | 1/2005 | Chien .......................... 257/777 |
| 6,859,054 | B1 | * | 2/2005 | Zhou et al. .................. 324/754 |
| 6,876,212 | B2 | * | 4/2005 | Fjelstad ....................... 324/754 |
| 7,121,839 | B2 | * | 10/2006 | Rathburn ...................... 439/66 |
| 7,368,927 | B2 | * | 5/2008 | Smith et al. .................. 324/754 |
| 7,403,024 | B2 | * | 7/2008 | Maruyama et al. .......... 324/754 |
| 2006/0186905 | A1 | * | 8/2006 | Kohashi et al. ............. 324/754 |

* cited by examiner

*Primary Examiner*—Ha Tran T. Nguyen
*Assistant Examiner*—Richard Isla Rodas
(74) *Attorney, Agent, or Firm*—Porter, Wright, Morris & Arthur, LLP

(57) ABSTRACT

The present invention relates to a test socket for a semiconductor device, which may correspond to a narrow pitch of terminal interval and high speed test in a simplified structure, thereby reducing manufacturing cost thereof. The test socket for a semiconductor device includes conductive substrates having contact point parts exposed at upper and lower surfaces for contacting the terminals of the semiconductor device and the lead terminals of the test board, and slant parts connecting the contact point parts and facing each other in repetitive arrangement, and an insulating elastic element filled in positions where the slant parts are formed as the contact point parts of the conductive substrate are exposed to the outside so as to fix the conductive substrates.

4 Claims, 6 Drawing Sheets

TEST SOCKET FOR SEMICONDUCTOR

BACKGROUND OF THE INVENTION

1. Field of the Invention

The present invention relates to a test socket for a semiconductor device, and more particularly to, a test socket for a semiconductor device which may correspond to a narrow pitch of terminal interval and high speed test in a simplified structure, thereby reducing manufacturing cost thereof.

2. Discussion of Related Art

Recently, demands for semiconductor devices having characteristics such as multiple functions, high-speed operations and low power consumption have been increased in the corresponding industrial fields.

Therefore, as for a semiconductor device in the package shape, a Ball Grid Array BGA realizing multiple pins having ball-shaped external terminals formed on a lower surface of a body part thereof has been generalized rather than a Quad Flat Package QFP having external terminals protruded outward from a side surface of a body part thereof.

Further, a device for testing electric characteristics of the package has been changed according to the changing trends of the package type semiconductor devices described above. As an example, a testing device in the shape of socket has been developed and proposed in various ways in order to mount or release such a package to test, which is electrically connected to a testing device may be detachably mounted to the testing device.

FIG. 1 shows a structure of a prior art testing socket for a semiconductor device. An insulating substrate 5 is formed with a plurality of through holes 6, which are formed penetratingly in the vertical direction, and conductive rubbers 3 are filled in the through holes 6.

The prior art test socket is in electric connection in such a manner that top surfaces of the conductive rubbers 3 contact terminals 2 of a semiconductor device 1 and lower surfaces of the conductive rubbers 3 contact lead terminals 7 of a test board 8.

As described above, a prior art socket 4 is formed of the conductive rubbers 3, in which metal conductive substances such as Au are mixed inside.

Therefore, the upper parts of the conductive rubbers 3 are pressed by the terminals 2 of the semiconductor device 1 and the lower parts of the conductive rubbers 3 are pressed by the lead terminals 7 of the test board 8, so that the conductive substances mixed in the conductive rubbers 3 and formed in the shape of ball become in contact, causing the electric connection state.

The prior art socket 4 using the conductive rubbers 3 realizes, however, the electric connection via the conductive rubbers 3 filled in the through holes 6 of the insulating substrate 5.

That is, large forces have to be applied to the upper and lower parts of the conductive rubbers 3 in order to generate sufficient connection of the metal substances, which are mixed in the conductive rubbers 3, wherein such contact causes damage of the semiconductor device 1.

Therefore, the electric contact cannot be kept in the stable state with reproducibility, and stable and reliable test cannot be achieved.

Therefore, the prior art test socket for a semiconductor device has problems that the large forces have to be repetitively applied and that the repetitively applied forces generate the damage of the semiconductor device.

Further, since the conductive rubbers 3 are formed of silicon materials for the sake of the characteristics thereof, pollutants are apt to stuck on surfaces of the test socket by the own viscosity of the conductive rubbers 3, wherein such pollution results in defects in the electric connection and polluted portions of contact parts are not easy to clean.

Furthermore, since the conductive rubbers 3 are formed of silicon containing the metal materials, response speed is not sufficiently high and continuity of signals becomes deteriorated.

SUMMARY OF THE INVENTION

Therefore, the present invention is derived to resolve the above and any other disadvantages of the prior art, and an object of the invention is to provide a test socket for a semiconductor device in which plate-shaped conductive substrates in a relatively simple structure are folded continuously to correspond a very narrow pitch between terminals of a semiconductor device and high speed testing for the semiconductor device.

The present invention has another object to provide a test socket for a semiconductor device, which may correspond to semiconductor devices in various shapes, thereby maximizing the utility of the test socket.

The present invention has a further object to provide a test socket for a semiconductor device, in which reliability of the test socket and convenience of use may be improved.

In order to achieve the above objects, according to the present invention, there is provided a test socket for a semiconductor device, which are electrically connected to terminals of a semiconductor device and lead terminals of a test board for testing the semiconductor device, including:

conductive substrates having contact point parts exposed at upper and lower surfaces for contacting the terminals of the semiconductor device and the lead terminals of the test board, and slant parts connecting the contact point parts and facing each other in repetitive arrangement; and an insulating elastic element filled in positions where the slant parts are formed as the contact point parts of the conductive substrate are exposed to the outside so as to fix the conductive substrates.

Therefore, the test socket for a semiconductor device according to the present invention as above may test a semiconductor device stably in a short time via a simple structure.

BRIEF DESCRIPTION OF THE DRAWINGS

The objects, features and advantages of the present invention will be more clearly understood from the following detailed description in conjunction with the accompanying drawings, in which.

DETAILED DESCRIPTION OF THE PREFERRED EMBODIMENTS

Now, a test socket for a semiconductor device according to the present invention will be described in more detail in the structure and operation thereof with reference to the accompanied drawings.

Figure 1:
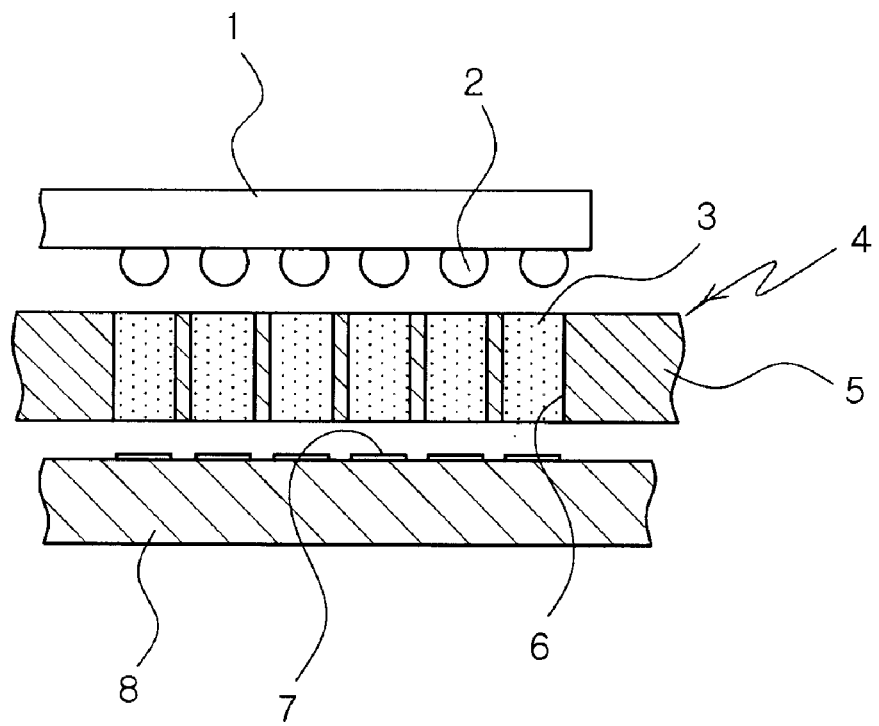
FIG. 1 is a sectional view showing a structure of a prior art test socket for a semiconductor device.

FIG. 1 is a partial sectional view showing a structure of a prior art test socket for a semiconductor device.

Figure 2A:
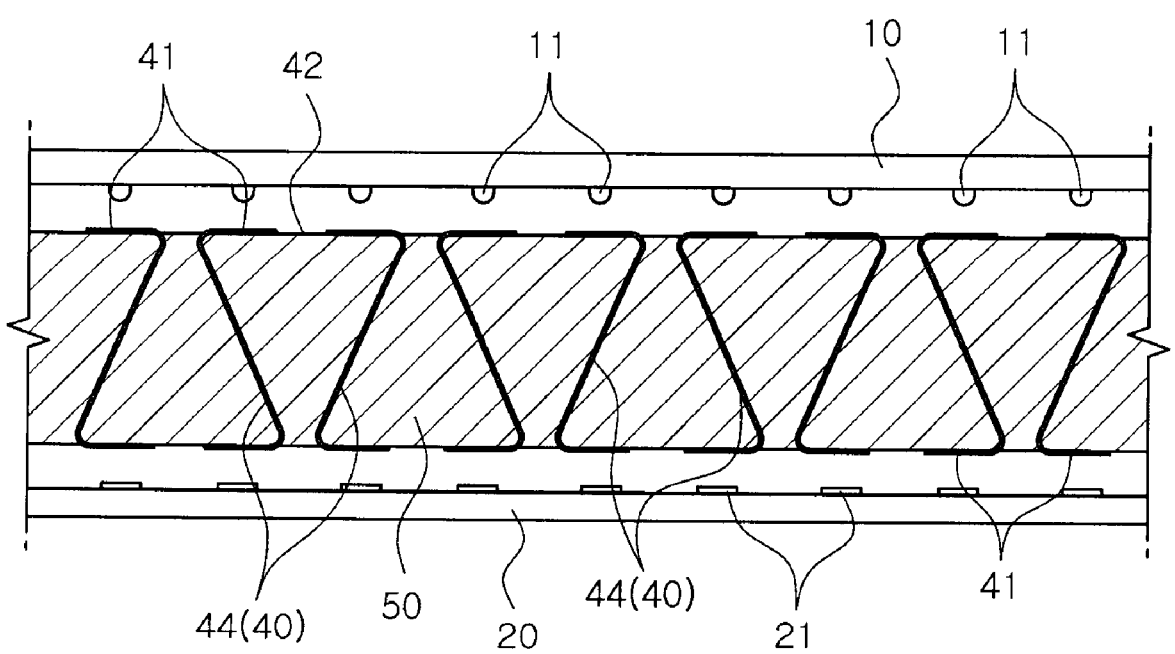
FIG. 2a and FIG. 2b are sectional views showing a test socket for a semiconductor device according to a preferred embodiment of the present invention.
Figure 2B:
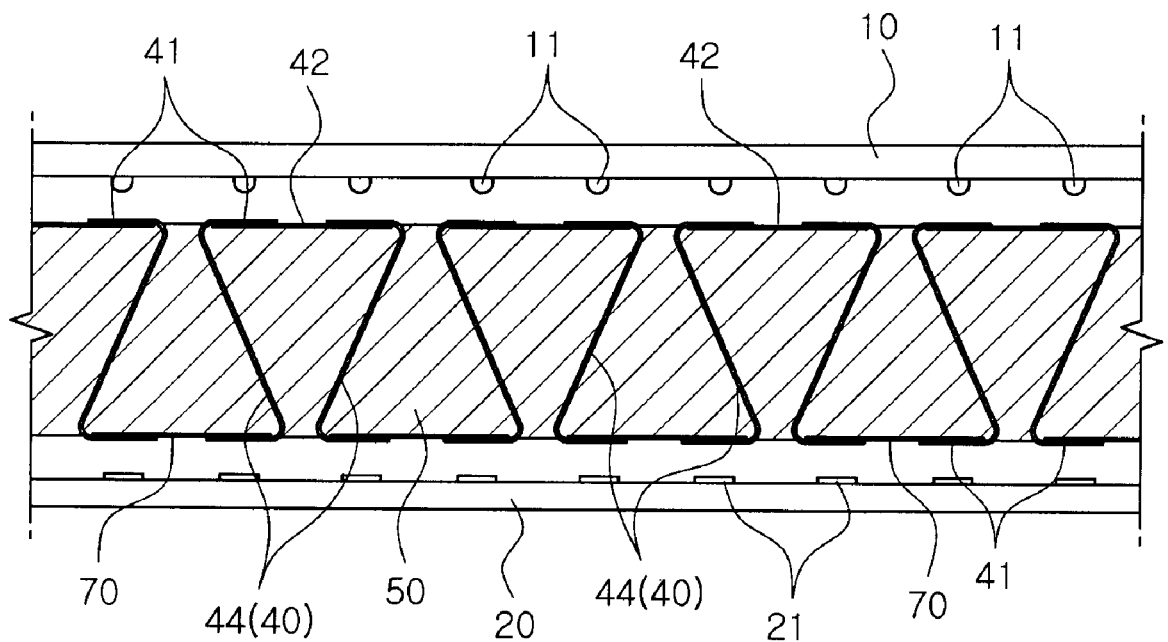

FIG. 2a and FIG. 2b are sectional views showing a structure of a test socket for a semiconductor device according to a preferred embodiment of the present invention.

Figure 3:
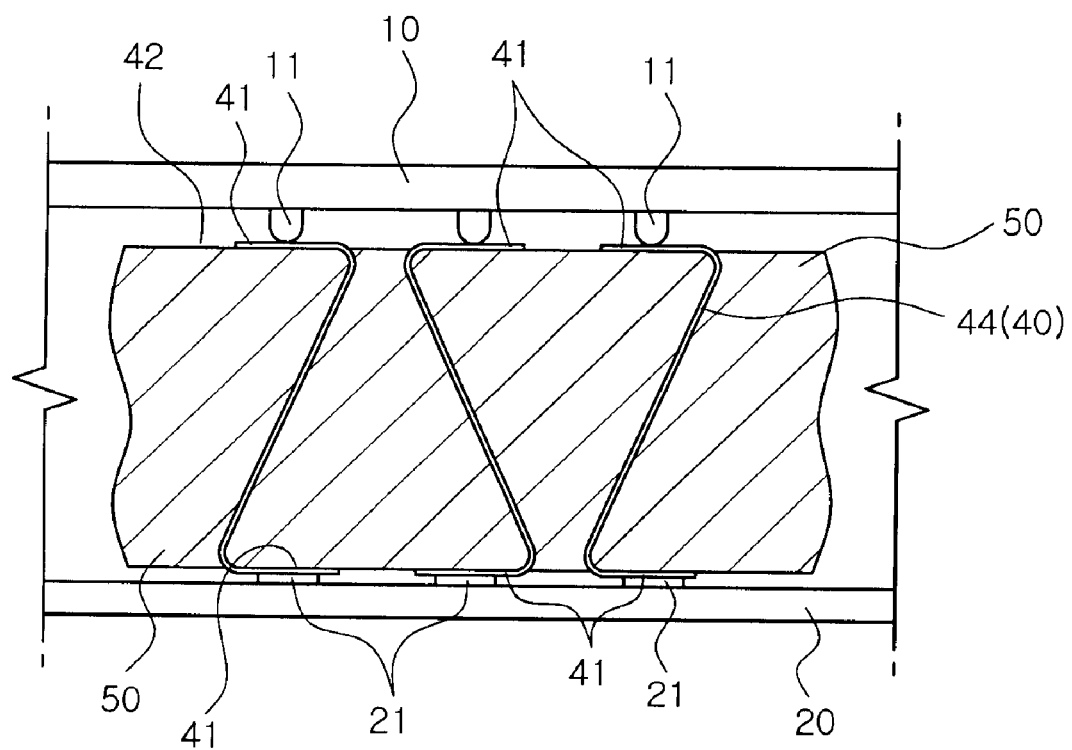
FIG. 3 is a sectional view showing a state that a semiconductor device is in contact with the test socket to be tested according to the preferred embodiment of the present invention.

FIG. 3 is a view showing a state that a semiconductor device is in contact with the test socket for a semiconductor device according to the present invention so that the test for the semiconductor device is carried out by the test socket.

Figure 4:
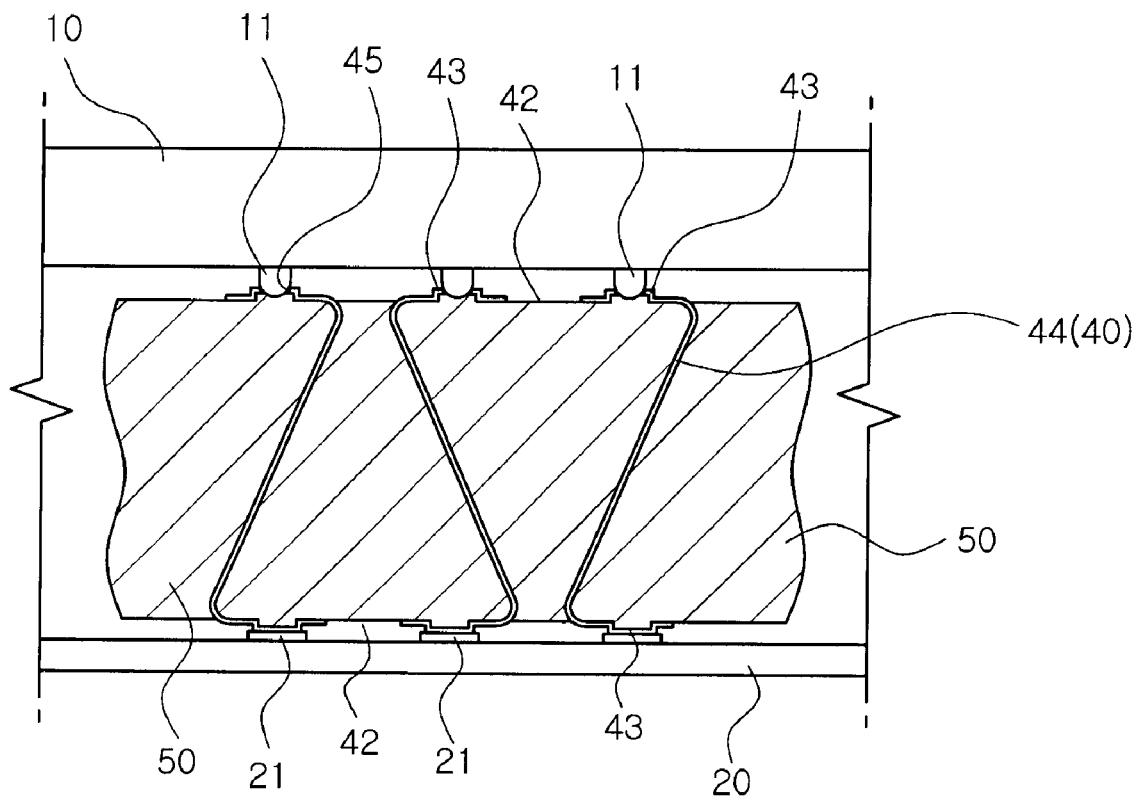
FIG. 4 and FIG. 5 are sectional views showing protrusion parts formed in contact point parts of plate-shaped insulating substrates according to different preferred embodiments of the present invention.
Figure 5:
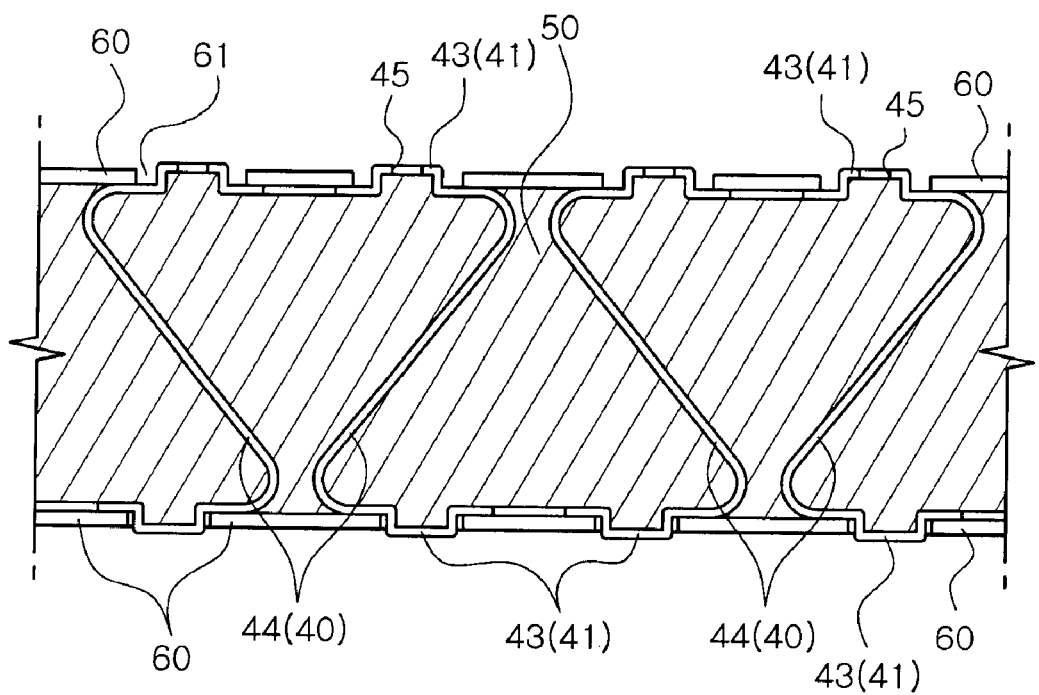

FIG. 4 and FIG. 5 are sectional views showing a test socket for a semiconductor device according to other preferred embodiments of the present invention, wherein protrusion parts and connection holes are formed at contact point parts of plate-shaped conductive substrates.

Figure 6:
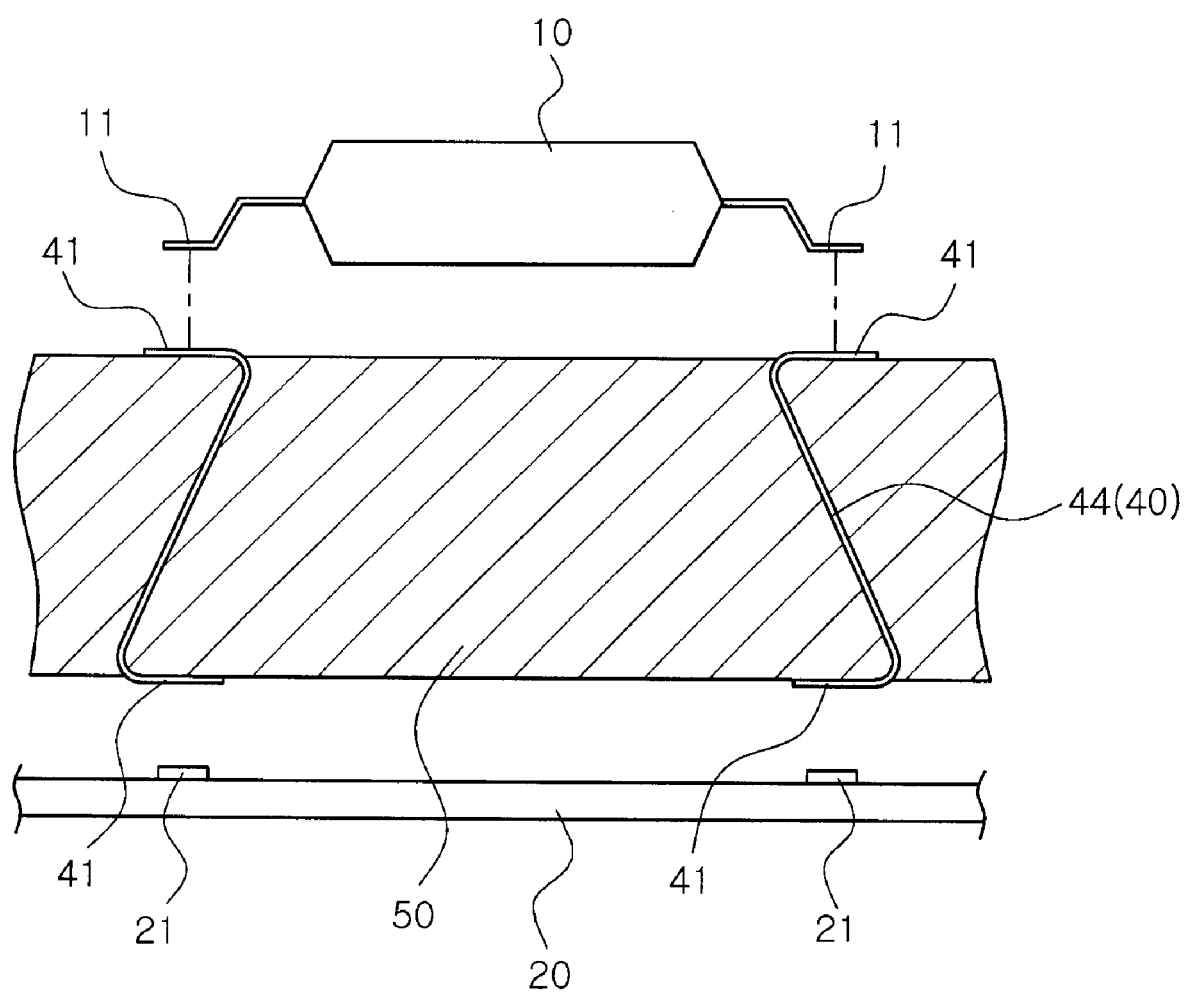
FIG. 6 is an expanded view showing principal parts of a test socket for a semiconductor according to a further preferred embodiment of the present invention.

FIG. 6 is a view showing a state that a semiconductor device in a different shape is in contact with the test socket of the present invention and a test for the semiconductor device is carried out.

Figure 7:
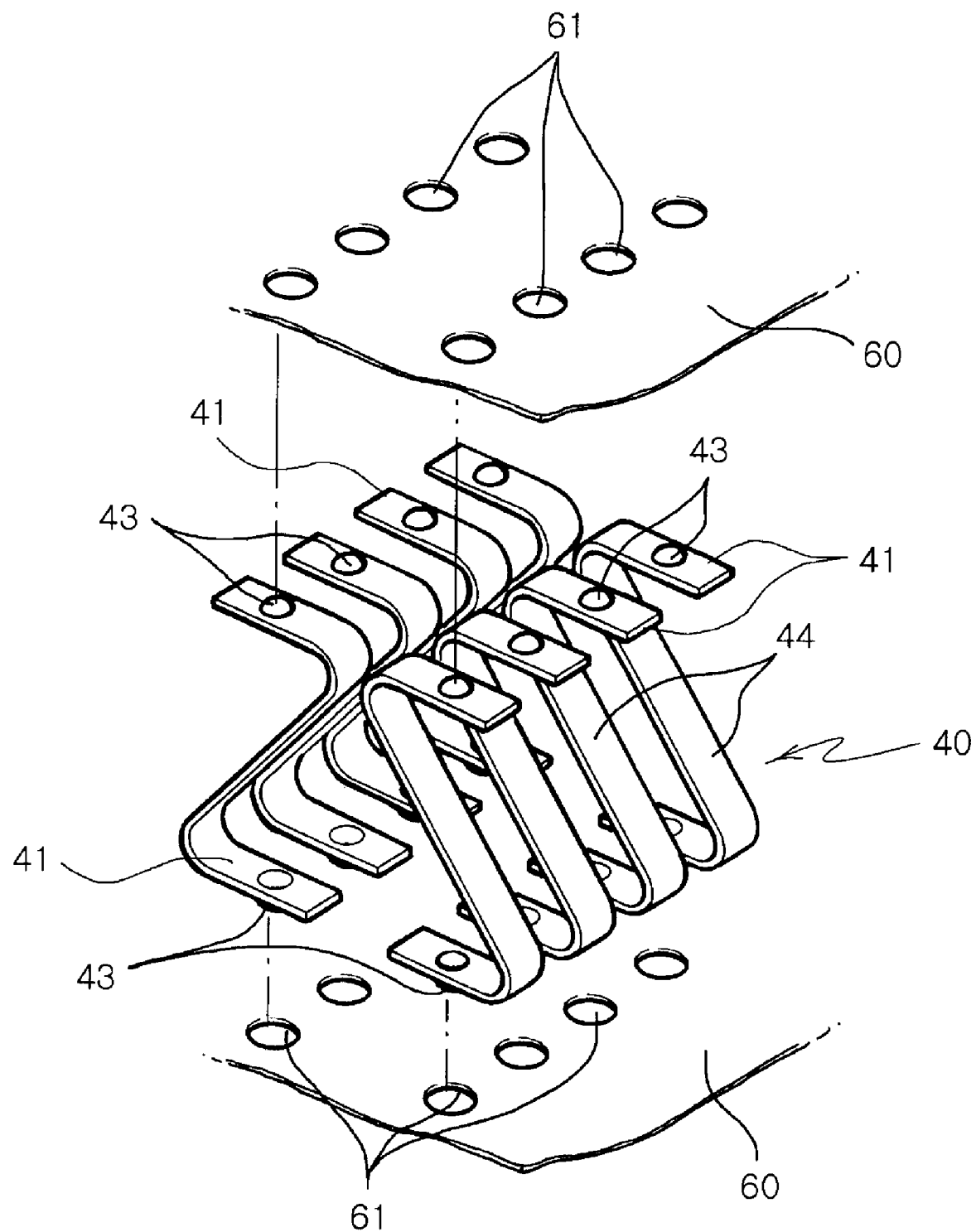
FIG. 7 is an exploded perspective view showing a structure of a test socket for a semiconductor according to a still further preferred embodiment of the present invention, wherein an insulating film is adhered to top parts of protrusion parts, which are formed at contact point parts of conductive substrates.

FIG. 7 is an exploded perspective view showing a structure of a test socket for a semiconductor device according to a further preferred embodiment of the present invention, wherein insulating films are attached to upper and lower parts of protrusion parts which are formed on contact point parts of conductive substrates.

Figure 8:
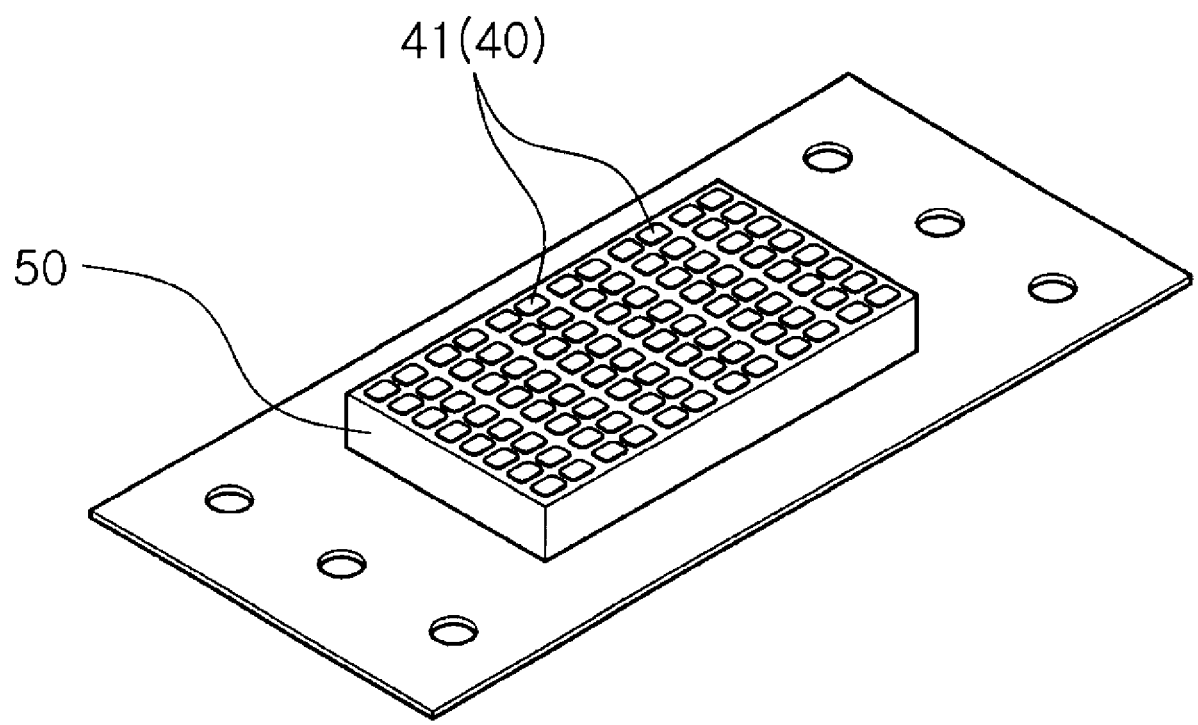
FIG. 8 is a perspective view showing a test socket finished according to a preferred embodiment of the present invention.

FIG. 8 is a perspective view showing a shape of a test socket finished according to the present invention.

As shown in the drawings, in a test socket for a semiconductor device according to the present invention, a pair of conductive substrates 40 face each other and such pairs of conductive substrates 40 are continuously disposed, wherein the conductive substrates 40 are fixed by filling insulating elastic elements 50 in positions of slant parts 44.

Contact point parts 41 are horizontally exposed at upper parts and lower parts of insulating elastic elements 50 respectively, wherein the upper contact point parts 41 are exposed to electrically contact terminals 11 of a semiconductor device 10.

Further, the contact point parts 41, which are exposed downward, electrically contact lead terminals 21 of a test board 20 for carrying out testing for the semiconductor device 10.

The conductive substrates 40 are formed in the shape of plate with a thin thickness and electrically conductive, wherein the conductive substrates 40 are symmetrically folded in the shape of "Z" continuously and repetitively. The contact point parts 41 are formed at upper parts and lower parts of the conductive substrates 40 horizontally to contact the terminals 11 of the semiconductor device 10 and the lead terminals 21 of the test board 20.

And, slant parts 44 connect the upper contact point parts 41 to the lower contact parts 41 in slant directions.

In the process of forming the test socket of the present invention, neighboring ones of the upper and lower contact point parts 41 of neighboring ones of the conductive substrates 40 are already connected to each other by connection parts 42 and the slant parts 44 are folded symmetrically with each other, so that the conductive substrates 40 are connected to each other into a single body and the insulating elastic elements 50 are filled into positions of the slant parts 44.

Therefore, the slant parts 44 cannot move out of their positions but fixed in the shape by the insulating elastic elements 50. In this state, the connection parts 42 between the neighboring contact point parts 41, which are exposed at upper and lower parts of the neighboring conductive substrates 40 and connected to each other, are cut via corrosion treatment by carrying out etching, so that a finished test socket of the present invention is achieved.

As for a method for cutting the connection parts 42, the conductive substrates 40 are folded symmetrically as shown in the FIG. 2a and FIG. 2b. And then, electrolytic Au-plating is carried out, wherein films are attached to the contact point parts 41 to avoid Au-plating thereof and the films are removed after the plating so that the connection parts 42 are corroded and cut by a corrosion treatment solution in the etching step.

As the molding is finished as above, the conductive plates 40 are symmetrically formed in the shape of approximate "Z" so that the conductive substrates 40 are insulated from the neighboring ones and electrically connected only via the upper and lower contact point parts 41, which are connected to each other via the slant parts 44.

As shown in FIG. 2b, the conductive substrates 40, from which the connection parts 42 are cut away by the above procedure, are preferably attached with reinforcement films 70 inward the contact point parts 41 so as to prevent the conductive substrates 40 from being deviated from their own positions by movement or deviation possibly generated in the process of filling of the insulating elastic elements 50 or the etching.

The reinforcement films 70 are formed of electric insulating materials having high adhesiveness and serves for reinforcing the contact point parts 41 to prevent deviation of the contact point parts 41 from their own positions and shapes even when the contact point parts 41 are separated from each other.

The contact point parts 41 are attached with insulating films 60 to be respectively fixed in positions at upper and lower parts of the test socket, as shown in FIG. 7. In practical use, protrusion parts 43 may be formed to be protruded from the contact point parts 41 beyond the insulating elastic elements 50 for improving contact with the terminals 11 of the semiconductor device 10 and the lead terminals 21 of the test board 20.

That is, since the protrusion parts 43 formed at the contact point parts 41 of the conductive substrates 40 are protruded via connection holes 61 of the insulating films 60, the protrusion parts 43 are protruded by penetrating the thin insulating films 60, thereby contacting the terminals.

The protrusion parts 43 are preferably formed with connection holes 45, as shown in FIG. 4 and FIG. 5, in order to prevent errors.

That is, the protrusion parts 43 are formed with the connection holes 45 in the size enough to insert the terminals 11 of the semiconductor device 10, so that precise electric connection is achieved and an error rate in a testing work may be decreased.

The insulating elastic elements 50 are formed of the silicon materials having superior elasticity and restoring force, and fix the positions of the conductive substrates 40, which are separated from each other by etching.

Further, the insulating elastic elements 50 secure sufficient elasticity.

According to the present invention, in the test socket in the above structure, the terminals 11 or solder balls of the semiconductor device 10 contact the upper contact point parts 41 of the folded conductive substrates 40 as the semiconductor device 10 is applied with a predetermined force from above for testing the semiconductor device 10. Then, the lower contact point parts 41 at the opposite sides of the conductive substrates 40 contact the lead terminals 21 of the test board 20 by the pressure.

In this situation, signals of the test board 20 are transmitted to the terminals 11 of the semiconductor device 10 at the contact point parts 41 of the conductive substrates 40 via the lead terminals 21, and performance or defects of the semiconductor device 10 may be checked through the signal transmission.

Even though the terminals 11 of the semiconductor device 10 are disposed downward from side surfaces thereof instead of the lower surface, as shown in FIG. 6, the contact point parts 41 of the conductive substrates 40 of the present invention may be employed.

In other words, the semiconductor device in various shape, for example, a semiconductor device 10 having terminals 11 of a predetermined distance, as shown in FIG. 6, may be also checked in the performance or defects by simply setting a width of the conductive substrates 40 widely.

Therefore, a test socket for a semiconductor device according to the present invention may carry out the test stably in a short time even though the terminals of the semiconductor device are formed very narrowly.

According to the present invention as described above, first, a test socket for a semiconductor device may be formed in a relatively simple structure.

Second, a semiconductor device may be tested stably in a short time while satisfying a low manufacturing cost.

Third, the test socket of the present invention may be compatibly employed for various semiconductor terminals such as solder balls, lead terminals and the like.

Fourth, the test socket of the present invention may satisfy the trends toward the increase of operation speed, thereby maximizing utility thereof.

Therefore, the test socket for a semiconductor device according to the present invention may improve the reliability and working convenience in the testing.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A test socket for a semiconductor device (10) comprising:
    conductive substrates (40) electrically connected to terminals (11) of the semiconductor device (10) and lead terminals (21) of a test board (20);
    an insulating elastic element (50) to fix the conductive substrates (40); and
    wherein the conductive substrates (40) have contact point parts (41) exposed to the outside of the test socket on upper and lower surfaces of the insulating elastic element (50) to be in contact with the terminals (11) of the semiconductor device (10) and the lead terminals (21) of the test board, the conductive substrates have slant parts (44) provided to connect the contact point parts (41) on upper and lower surfaces of the insulating elastic element (50) so that the conductive substrates (40) are each in the shape of Z, and the conductive substrates alternately face in opposite directions so that adjacent pairs of the conductive substrates are symmetrically and repetitively positioned to face each other.

2. The test socket as claimed in claim 1, wherein reinforcement films are adhered between neighboring ones of the contact point parts, which are formed on the upper surface and the lower surface of neighboring ones of the conductive substrates.

3. The test socket as claimed in claim 2, wherein protrusion parts are protruded from the contact point parts and formed with connection holes.

4. The test socket as claimed in claim 1, wherein protrusion parts are protruded from the contact point parts and formed with connection holes.

* * * * *